(12) United States Patent
Okada

(10) Patent No.: US 11,131,826 B2
(45) Date of Patent: Sep. 28, 2021

(54) WIEN FILTER AND ELECTRON-OPTICS APPARATUS

(71) Applicant: EBARA CORPORATION, Tokyo (JP)

(72) Inventor: Shinichi Okada, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 486 days.

(21) Appl. No.: 16/272,208

(22) Filed: Feb. 11, 2019

(65) Prior Publication Data

US 2019/0250361 A1 Aug. 15, 2019

(30) Foreign Application Priority Data

Feb. 14, 2018 (JP) .............................. JP2018-023634

(51) Int. Cl.
*G02B 7/02* (2021.01)
*G02B 5/20* (2006.01)
*H01J 37/30* (2006.01)
*H01J 49/28* (2006.01)

(52) U.S. Cl.
CPC ................. *G02B 7/02* (2013.01); *G02B 5/20* (2013.01); *H01J 37/30* (2013.01); *H01J 49/288* (2013.01)

(58) Field of Classification Search
CPC .............. G02B 7/02; G02B 5/20; H01J 37/30
See application file for complete search history.

(56) References Cited

FOREIGN PATENT DOCUMENTS

JP 2016-127023 A 7/2016

*Primary Examiner* — Joseph L Williams
(74) *Attorney, Agent, or Firm* — Pearne & Gordon LLP

(57) ABSTRACT

A Wien filter to be disposed inside a lens barrel made of a magnetic material includes: a plurality of electromagnetic poles disposed at equal angular intervals about a center axis of the lens barrel; a first magnetic shield disposed so as to cover the area around the plurality of electromagnetic poles; and a second magnetic shield disposed so as to cover the area around the first magnetic shield. The first magnetic shield is supported by a first support member made of a non-magnetic material provided at an inner surface of the second magnetic shield. The second magnetic shield is supported by a second support member made of a magnetic material provided at an inner surface of the lens barrel.

7 Claims, 4 Drawing Sheets

WIEN FILTER AND ELECTRON-OPTICS APPARATUS

CROSS-REFERENCE TO RELATED APPLICATIONS

This application claims the benefit of Japanese Priority Patent Application JP 2018-023634 filed on Feb. 14, 2018, the entire contents of which are incorporated herein by reference.

FIELD

The present technology relates to a Wien filter that forms orthogonal magnetic and electric fields and is used as an electron beam energy separator.

BACKGROUND AND SUMMARY

Semiconductor inspection apparatuses hitherto have employed technologies and devices adapted for 100 nm design rules. However, as the samples subject to inspection become more diverse, for example including wafers, exposure masks, EUV masks, nano-imprint lithography (NIL) masks, and substrates, there is currently a demand for technologies and devices adapted for samples using 5 to 30 nm design rules. Namely, there is a demand for technologies and devices adapted for 5 to 30 nm node generations in line/space (L/S) and half-pitch (HP) patterns. To inspect such samples with an inspection apparatus, high resolutions need to be obtained.

Herein, samples include, for example, exposure masks, EUV masks, nano-imprint lithography masks (and templates), semiconductor wafers, substrates for optical elements, and substrates for optical circuits. These samples include those with patterns and those without patterns. Those with patterns include those with protrusions and recesses and those without. Patterns without protrusions and recesses are pattern-formed using different materials. Samples without patterns include those which have been coated with an oxide film and those not coated with an oxide film.

The present applicants have previously proposed an image-projection electron beam inspection apparatus that captures secondary charged particles that change according to the properties of the surface of a sample to form image data, and that performs high-throughput inspections of patterns and the like formed on the surface of a sample on the basis of this image data (see JP 2016-127023 A).

However, with this image-projection electron beam inspection apparatus, although it is desirable to have a shorter optical path length in the electron-optics system in order to suppress a drop in resolution due to the space charge effect, particularly in cases in which a high-current beam is used, if the Wien filter and the magnetic lens are installed near one another in order to shorten the optical path length, stray magnetic field from the magnetic lens sometimes enters into the Wien filter.

Further, in cases in which another device is installed in the area around the electron beam inspection apparatus, an external magnetic field generated by this device sometimes enters into the Wien filter.

Since the relationship between the electric and magnetic fields for causing the electron beam to propagate in a straight line (the Wien condition) will no longer hold if a stray magnetic field or an external magnetic field enters into the Wien filter, optical characteristics are adversely affected. For example, the optical axis may be bent or there may be a drop in resolution.

It is desirable to provide a Wien filter with a heightened magnetic shielding effect.

A Wien filter according to an embodiment is a Wien filter to be disposed inside a lens barrel made of a magnetic material, including:

a plurality of electromagnetic poles disposed at equal angular intervals about a center axis of the lens barrel;

a first magnetic shield disposed so as to cover the area around the plurality of electromagnetic poles; and a second magnetic shield disposed so as to cover the area around the first magnetic shield, wherein the first magnetic shield is supported by a first support member made of a non-magnetic material provided at an inner surface of the second magnetic shield, and the second magnetic shield is supported by a second support member made of a magnetic material provided at an inner surface of the lens barrel.

DETAILED DESCRIPTION OF NON-LIMITING EXAMPLE EMBODIMENTS

Figure 1:
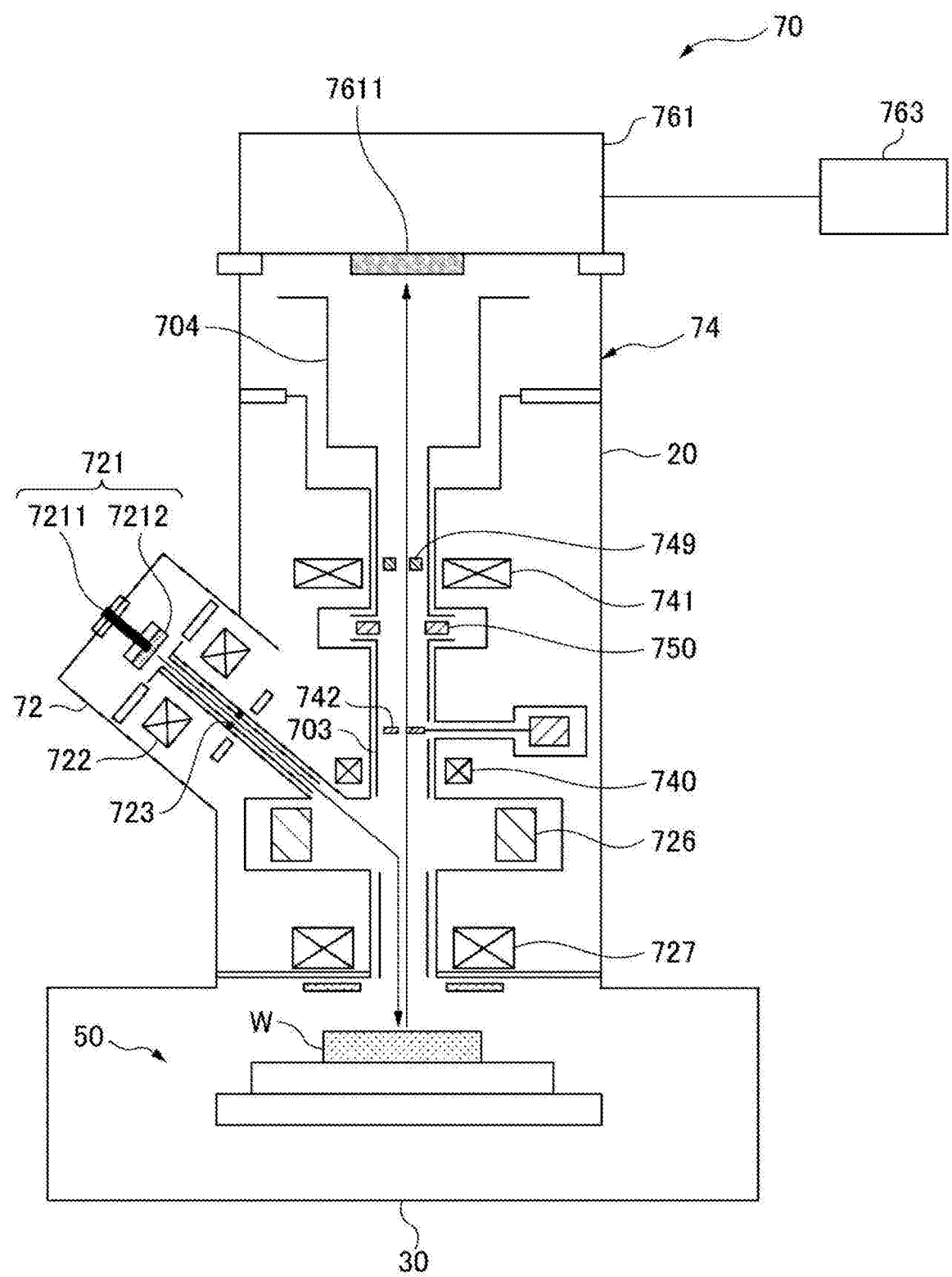
FIG. 1 is a diagram illustrating the configuration of an electron-optics apparatus provided with a Wien filter according to an embodiment.

A Wien filter according to a first aspect of an embodiment is a Wien filter to be disposed inside a lens barrel made of a magnetic material, including:

a plurality of electromagnetic poles disposed at equal angular intervals about a center axis of the lens barrel;

a first magnetic shield disposed so as to cover the area around the plurality of electromagnetic poles; and a second magnetic shield disposed so as to cover the area around the first magnetic shield, wherein the first magnetic shield is supported by a first support member made of a non-magnetic material provided at an inner surface of the second magnetic shield, and the second magnetic shield is supported by a second support member made of a magnetic material provided at an inner surface of the lens barrel.

According to this aspect, since the first magnetic shield is disposed so as to cover the area around the plurality of electromagnetic poles, a desired magnetic field can be stably formed at the inner side of the plurality of electromagnetic poles. Further, since the second magnetic shield is disposed so as to cover the area around the first magnetic shield and the second magnetic shield is magnetically connected to the lens barrel via the second support member, although stray magnetic field from a magnetic lens in close proximity to the Wien filter flows into the lens barrel from the second magnetic shield via the second support member, since the first magnetic shield and the second magnetic shield are magnetically insulated by the first support member, stray magnetic field does not flow into the first magnetic shield.

Further, although a pulsed external magnetic field generated by an external high-voltage power supply or the like will flow into the second magnetic shield from the lens barrel via the second support member, since the first magnetic shield and the second magnetic shield are magnetically insulated by the first support member, such external magnetic field will not flow into the first magnetic shield. Thus, stray magnetic fields and external magnetic fields are prevented from entering inside the first magnetic shield, and a desired magnetic field formed at the inner side of the plurality of electromagnetic poles is prevented from being disturbed by stray magnetic fields and external magnetic fields. Consequently, a high magnetic shielding effect can be obtained.

A Wien filter according to a second aspect of the embodiment is the Wien filter according to the first aspect, wherein:

an electron beam pass-through hole centered on the center axis of the lens barrel is formed in each of the first magnetic shield and the second magnetic shield; and the diameter of the electron beam pass-through hole in the second magnetic shield is smaller than the diameter of the electron beam pass-through hole in the first magnetic shield.

According to this aspect, since the diameter of the electron beam pass-through hole in the second magnetic shield is small, stray magnetic field from a magnetic lens in close proximity to the Wien filter is suppressed from passing through the electron beam pass-through hole in the second magnetic shield and entering therein. Consequently, the magnetic shielding effect can be further enhanced.

A Wien filter according to a third aspect of the embodiment is the Wien filter according to the first or second aspect, wherein:

the first magnetic shield has a plurality of shielding element members disposed in a nested manner; and of adjacent shielding element members, an inner shielding element member is supported by a support member made of a non-magnetic material provided at an inner surface of an outer shielding element member.

According to this aspect, since the plurality of shielding element members of the first magnetic shield disposed in a nested manner are magnetically insulated from one another by the support members, even if, for example, a stray magnetic field or an external magnetic field that has flowed into the second magnetic shield were to flow into the outer shielding element member, this would not readily flow into the inner first shielding element member. Consequently, the magnetic shielding effect can be further enhanced.

A Wien filter according to a fourth aspect of the embodiment is the Wien filter according to the third aspect, wherein:

a hole for creating a vacuum is formed in each shielding element member; and of adjacent shielding element members, the hole for creating a vacuum in the inner shielding element member and the hole for creating a vacuum in the outer shielding element member are formed in mutually differing angular directions about the center axis of the lens barrel.

According to this aspect, even if the plurality of shielding element members of the first magnetic shield are disposed in a nested manner, by forming the holes for creating a vacuum in adjacent shielding element members in mutually differing angular directions, a vacuum can be efficiently created in the narrow spaces between the shielding element members.

A Wien filter according to a fifth aspect of the embodiment is the Wien filter according to any one of the first to fourth aspects, wherein:

the second support member is provided so as to extend circumferentially along the inner surface of the lens barrel.

According to this aspect, due to the large size of the second support member, the combined weight of the first magnetic shield, the first support member, and the second magnetic shield can be stably supported, the magnetic connection between the second magnetic shield and the lens barrel can be strengthened, and the magnetic shielding effect can be further enhanced.

A Wien filter according to a sixth aspect of the embodiment is the Wien filter according to any one of the first to fifth aspects, wherein:

there are at least eight of the electromagnetic poles.

According to this aspect, a desired magnetic field can be easily formed at the inner side of the plurality of electromagnetic poles.

An electron-optics apparatus according to a seventh aspect of the embodiment includes:

the Wien filter according to any one of the first to sixth aspects; and a magnetic lens disposed in close proximity to the Wien filter in an axial direction.

Detailed description follows regarding specific examples of embodiments, with reference to the accompanying drawings. Note that in the drawings accompanying the present specification, as appropriate, the scale, length and width, and other dimensional ratios are modified and exaggerated compared to those in actuality in order to facilitate understanding of the illustrations.

<Electron-Optics Apparatus>

FIG. 1 is a diagram illustrating the configuration of an electron-optics apparatus 70 according to an embodiment. Note that in the following description, although a configuration is described in which the electron-optics apparatus 70 is, for example, an electron beam inspection apparatus, the electron-optics apparatus 70 is not limited to being an electron beam inspection apparatus, and may be an electron beam emitting apparatus or an electron microscope.

As illustrated in FIG. 1, the electron-optics apparatus 70 is provided with a primary optical system 72 that generates an electron beam, a secondary optical system 74 that forms an enlarged image of secondary-emission electrons or mirror electrons from a sample W, and a detector 761 that detects these electrons. An image processing unit 763 that processes signals from the detector 761 is connected to the detector 761.

The sample W is, for example, a silicon wafer, a glass mask, a semiconductor substrate, a semiconductor pattern substrate, or another substrate that has a metallic film. The electron-optics apparatus 70 according to the present embodiment detects the presence of extraneous matter on the surface of a sample W made of such a substrate. Extraneous matter is, for example, insulating matter, conductive matter, semiconducting material, or a composite thereof. Types of extraneous matter include particles, remnants from cleaning (organic matter), the products of reactions on the surface of the sample W, and the like.

The primary optical system 72 of the electron-optics apparatus 70 is configured to generate an electron beam and collectively irradiate a region of the sample W covering the detection size of the detector 761. The primary optical system 72 has an electron gun 721, a lens 722, an aperture 723, a Wien filter 726, and a lens 727.

The electron gun 721 has a laser beam source 7211 and a photoelectric surface cathode 7212. An electron beam is generated by the electron gun 721. The generated electron beam is accelerated, and is shaped by the lens 722 and the aperture 723. In the Wien filter 726, the electron beam is affected by Lorentz force exerted by the magnetic field and Coulomb force exerted by the electric field. The electron beam is incident to the Wien filter 726 obliquely from above, and is deflected vertically downward toward the sample W. The lens 727 projects an intermediate image formed near the Wien filter 726 onto the sample W. A primary beam is decelerated in the near of the sample W, and is incident to the sample W or is reflected in the vicinity of the sample W.

The primary optical system 72 emits both a charging electron beam for precharge and an imaging electron beam. The incidence energy (landing energy) of the primary beam on the sample W is defined by the difference between the sample potential and the acceleration potential of the electron gun. From test results, the difference between a precharge landing energy LE1 and a landing energy LE2 for the imaging electron beam is preferably 5 to 20 eV.

Regarding this point, when there is a potential difference between extraneous matter on the surface of the sample W and the surrounding region, the precharge landing energy LE1 is taken to have been emitted in a negatively-charged region. The charge-up voltage varies depending on the value of LE1. This is because the relative ratio of LE2 to LE1 changes (LE2 is the landing energy of the imaging electron beam as described above). When LE1 is large, the charge-up voltage increases, and thus a reflection point is formed at a position above the extraneous matter (at a position closer to the detector 761). The trajectory and transmittance of mirror electrons varies according to the position of the reflection point. Optimum charge-up voltage conditions are thus determined according to the reflection point. If LE1 is too low, the efficiency of mirror electron formation is reduced. The difference between LE1 and LE2 is desirably 5 to 20 eV. The value of LE1 is preferably 0 to 40 eV, and more preferably 5 to 20 eV.

The angle of incidence of the primary electron beam on the sample W can be established by adjusting conditions for the electric and magnetic fields of the Wien filter 726. For example, it is possible to set conditions for the Wien filter 726 such that the primary beam is perpendicularly incident to the sample W. To further increase sensitivity, it is effective to, for example, slightly tilt the angle of incidence of the electron beam of the primary optical system on the sample W. A suitable tilt angle is 0.05 to 10°, and preferably is approximately 0.1 to 3°.

Thus, by emitting an electron beam on the extraneous matter with a slight angle of incidence, signals from the extraneous matter are strengthened, and at the same time, because conditions can be formed whereby the trajectory of mirror electrons does not deviate from the center of the optical axis of the secondary optical system, the transmittance of the mirror electrons can be increased. Accordingly, a tilted electron beam is advantageously used when charging-up extraneous matter and guiding mirror electrons.

The sample W is on a stage device 50 disposed in a sample chamber 30, and extraneous matter is on the sample W. The primary beam is emitted onto the surface of the sample W with a landing energy LE of 5 to 10 eV. Due to the extraneous matter being charged up in advance, the primary beam electrons do not come into contact with the extraneous matter, but are reflected. Mirror electrons generated in this manner are guided to the detector 761 by the secondary optical system 74. At the same time, secondary-emission electrons are also generated by the primary beam emitted onto a surface 21 of the sample W that has not been charged up. However, the efficiency of secondary-electron emission due to electron radiation with a landing energy LE of approximately 5 to 10 eV is close to 0, and secondary electrons are emitted from the surface 21 of the sample W with an angular distribution close to Lambert's cosine law. Therefore, most of the secondary electrons are cut off by an aperture 742 of the secondary electron-optics system, and the proportion of secondary electrons that reach the detector 761 is low, for example approximately 0.5 to 4.0%. In contrast, since the ratio of mirror electrons to primary electrons is nearly 1, and dispersion of the primary electrons is less than the angular distribution of the secondary electrons, the mirror electrons reach the detector 761 with a high transmittance. Accordingly, signals originating from the extraneous matter are detected with high contrast.

An image of mirror electrons originating from the extraneous matter is projected onto the detector 761 with a larger size than in actuality due to the effect of the local electric field formed by the charged-up extraneous matter. The enlargement factor is as high as 5 to 50 times. Under typical conditions, the enlargement factor is often 20 to 30 times. Extraneous matter is able to be detected if the size of enlarged extraneous matter is at least three times larger than the pixel size of the detector 761. Thus, by decreasing the projection magnification of the secondary optical system 74 and increasing the pixel size of the detector 761 such that the surface area in which extraneous matter can be detected at one time is increased, high-speed, high-throughput inspection can be achieved.

For example, in cases in which extraneous matter is 20 nm in diameter, the pixel size of the detector 761 may, for example, be 60 nm, 100 nm, or 500 nm. In this example, it is possible to image and inspect extraneous matter using a detector 761 pixel size that is at least three times larger than the extraneous matter. This is a particularly advantageous feature for achieving higher throughput than with a SEM or the like.

The secondary optical system 74 is a means to enlarge the distribution of electrons reflected by the sample W or secondary electrons emitted from the surface 21 of the sample W, and project the enlarged distribution onto the detector 761. The secondary optical system 74 has lenses 727, 740, 741, an NA aperture 742, and the detector 761. Electrons are reflected by the sample W, and then pass once more through the objective lens 727 and the Wien filter 726. The electrons are then guided to the secondary optical system 74. In the secondary optical system 74, electron signals originating from the sample W pass through the lens 740, the NA aperture 742, and the lens 741, and are formed as an image onto the detector 761.

The NA aperture 742 serves to determine the transmittance and aberration of the secondary system. The size and the position of the NA aperture 742 are selected so that the difference between signals (mirror electrons and the like) from extraneous matter and signals from surrounding regions (normal regions) is increased. Alternatively, the size and the position of the NA aperture 742 may be selected so that the ratio of signals from extraneous matter to signals from the surrounding regions is increased. The S/N ratio can be increased in this manner.

For example, the NA aperture 742 can be selected having a diameter in a range of 50 to 3000 The electrons that are detected include a mixture of mirror electrons and secondary-emission electrons. In such circumstances, it is advantageous to select the aperture size in order to improve the S/N ratio of the mirror electron image. In this case, it is preferable to select the size of the NA aperture 742 so as to reduce the transmittance of the secondary-emission electrons and such that the transmittance of the mirror electrons can be maintained.

For example, when the angle of incidence of the primary electron beam is 3°, the angle of reflection of the mirror electrons is approximately 3°. In this case, it is preferable to select a NA aperture 742 size of an extent such that that the trajectory of the mirror electrons can pass through the NA aperture 742. A suitable size is 250 μm in diameter, for example. The transmittance of the secondary-emission electrons is reduced due to being limited by the NA aperture (250 μm in diameter). Consequently, the S/N ratio of the mirror electron image is able to be improved. If the aperture diameter is changed from 2000 to 250 μm, for example, the background gradient (noise level) can be reduced by at least one half.

Extraneous matter may be configured by any kind of material. For example, extraneous matter may be semiconducting, an insulating matter, a metal, or a mixture of these materials. Because a naturally-occurring oxide film or the like is formed on the surface of extraneous matter, extraneous matter is covered by an insulating material. Thus, even if the material of extraneous matter is metallic, charge-up occurs in the oxide film. This charge-up is utilized appropriately in the present example.

The detector 761 is a means to detect electrons guided by the secondary optical system 74. The detector 761 includes a two-dimensional image sensor 7611. A plurality of pixels are two-dimensionally arranged on the two-dimensional image sensor 7611.

An electron bombardment (EB) semiconductor sensor can be employed as the two-dimensional image sensor 7611. For example, an EB-CMOS sensor may be employed as the two-dimensional image sensor 7611. An electron beam (secondary beam) can be directly incident on an EB-CMOS sensor. Accordingly, there is no drop in resolution caused by a photoelectric conversion mechanism or an optical transmission mechanism, and a high modulation transfer function (MTF) and contrast are able to be obtained. Further, using an EB-CMOS sensor, the S/N ratio of weak signals from small extraneous matter is able to be increased. Accordingly, higher sensitivity can be achieved. The S/N ratio is improved 1.2 to 2 times. Note that an EB-CCD sensor or an EB-TDI sensor may be used as the two-dimensional image sensor.

A charge coupled device (CCD) or a time delay integration (TDI)-CCD may be also employed as the two-dimensional image sensor 7611. These sensors perform signal detection after converting electrons into light. For this reason, these sensors require a means for photoelectric conversion or the like. Accordingly, a photoelectric converter or a scintillator is used to convert electrons into light. Light image information is transmitted to the TDI that detects the light. Electrons are detected in this manner.

Note that the number of pixels in the two-dimensional image sensor 7611 can be set from 2 k×2 k to 10 k×10 k. The data rate for the two-dimensional image sensor 7611 can be set to 10 GPPS or lower. The pixel size of the two-dimensional image sensor 7611 can also be set from 1 to 15 μm.

The image processing unit 763 performs image processing, such as a noise reduction processing, addition processing, and sub-pixel alignment, on the secondary beam image obtained with the detector 761. The processing speed of the image processing unit 763 can be set to 10 GPPS or lower.

<Wien Filter>

Figure 2:
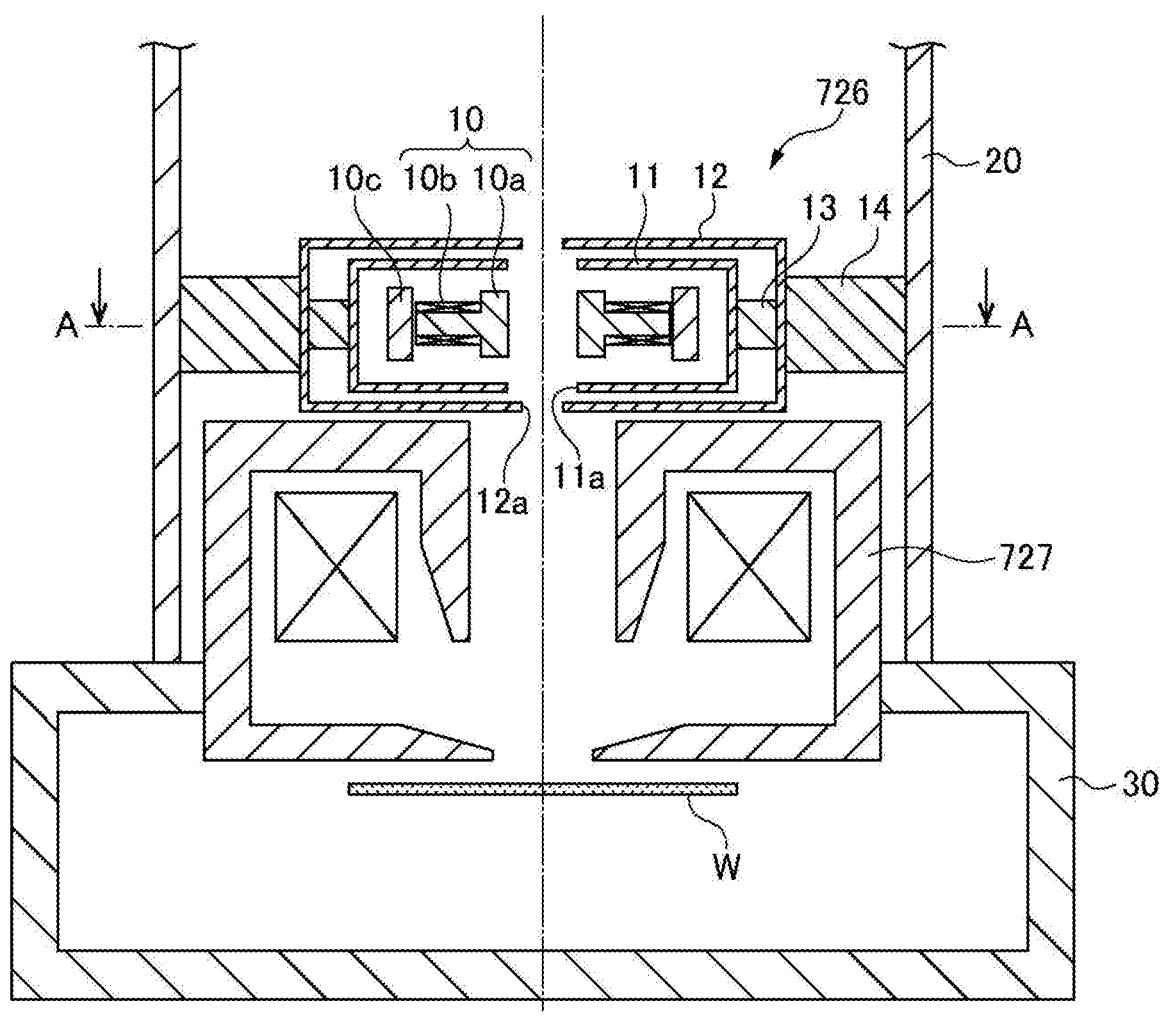
FIG. 2 is an enlarged view illustrating the vicinity of the Wien filter in the electron-optics apparatus illustrated in FIG. 1.
Figure 3:
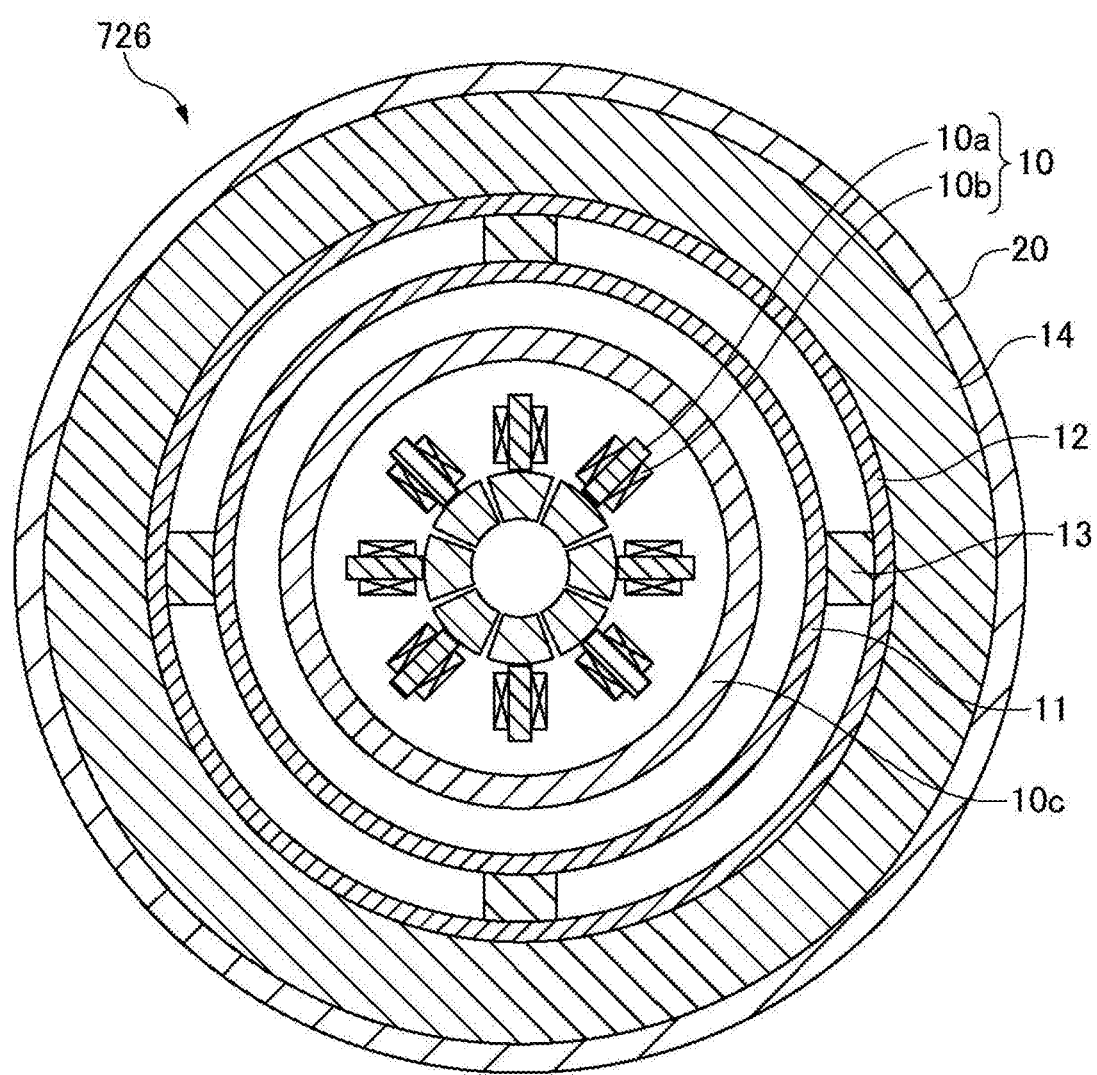
FIG. 3 is a diagram illustrating a cross-section of the Wien filter illustrated in FIG. 2 taken along line A-A.

Next, configuration for the Wien filter 726 according to an embodiment will be described in detail below. FIG. 2 is an enlarged view illustrating the vicinity of the Wien filter 726 in the electron-optics apparatus 70 illustrated in FIG. 1. FIG. 3 is a diagram illustrating a cross-section of the Wien filter 726 illustrated in FIG. 2 taken along line A-A.

As illustrated in FIG. 2 and FIG. 3, the Wien filter 726 is disposed inside a lens barrel 20 made of a magnetic material, and the Wien filter 726 is provided with a plurality of (eight, in the illustrated example) electromagnetic poles 10 disposed at equal angular intervals about the center axis of the lens barrel 20, a first magnetic shield 11 disposed so as to cover the area around the plurality of electromagnetic poles 10, and a second magnetic shield 12 disposed so as to cover the area around the first magnetic shield 11.

Each electromagnetic pole 10 has a pole piece 10a made of a magnetic material and a coil 10b wound around the pole piece 10a. A ring-shaped return yoke 10c made of a magnetic material is disposed at the outer side of the plurality of electromagnetic poles 10 about the center axis of the lens barrel 20, the return yoke 10c being disposed so as to surround the plurality of electromagnetic poles 10. Note that the number of electromagnetic poles 10 is not limited to eight, but in order to easily form a desired magnetic field at the inner side of the plurality of electromagnetic poles 10, it is preferable that there be at least eight electromagnetic poles 10.

As illustrated in FIG. 2 and FIG. 3, the first magnetic shield 11 and the second magnetic shield 12 are disposed in a nested manner.

The first magnetic shield 11 has a cylindrical shape including an upper base, a lower base, and a sidewall. An electron beam pass-through hole 11a centered on the center axis of the lens barrel 20 is formed in each of the upper base and the lower base. By disposing the first magnetic shield 11 so as to cover the area around the plurality of electromagnetic poles 10, it is possible to stably form a desired magnetic field at the inner side of the plurality of electromagnetic poles 10.

The second magnetic shield 12 has a cylindrical shape including an upper base, a lower base, and a sidewall. An electron beam pass-through hole 12a centered on the center axis of the lens barrel 20 is formed in each of the upper base and the lower base. As illustrated in FIG. 2, the diameter of the electron beam pass-through holes 12a in the second magnetic shield 12 is smaller than the diameter of the electron beam pass-through holes 11a in the first magnetic shield 11. Stray magnetic field from a magnetic lens (for example, the objective lens 727) in close proximity to the Wien filter 726 is thereby suppressed from passing through the electron beam pass-through holes 12a in the second magnetic shield 12 and entering therein.

As illustrated in FIG. 2 and FIG. 3, the first magnetic shield 11 is supported by first support members 13 made of a non-magnetic material provided at the inner surface of the second magnetic shield 12 (in the illustrated example, the inner surface of the sidewall thereof). The material of the first support members 13 is not particularly limited so long as the material is a non-magnetic material, and is, for example, titanium, copper, a ceramic, a resin, or the like. In cases in which a resin is used for the first support members 13, it is desirable that the resin emit little gas into a vacuum.

Having the first support members 13 connecting the first magnetic shield 11 and the second magnetic shield 12 together be made of a non-magnetic material magnetically insulates the first magnetic shield 11 from the second magnetic shield 12.

Although there are four first support members 13 in the example illustrated in FIG. 3, there is no limitation thereto, and there may be from one to three, or five or more first support members 13. In cases in which there are at least two first support members 13, it is preferable that the first support members 13 be provided at equal angular intervals about the center axis of the lens barrel 20.

As illustrated in FIG. 2 and FIG. 3, the second magnetic shield 12 is supported by a second support member 14 made of a magnetic material provided at the inner surface of the lens barrel 20. The material of the second support member 14 is not particularly limited so long as the material is a magnetic material, and, for example, pure iron is used therefor.

Having the second support member 14 connecting the second magnetic shield 12 and the lens barrel 20 together be made of a magnetic material magnetically connects the second magnetic shield 12 to the lens barrel 20.

In the example illustrated in FIG. 3, the second support member 14 is provided so as to extend circumferentially along the inner surface of the lens barrel 20. Thus, due to the large size of the second support member 14, the combined weight of the first magnetic shield 11, the first support members 13, and the second magnetic shield 12 can be stably supported, and the magnetic connection between the second magnetic shield 12 and the lens barrel 20 can be strengthened.

In a conventional electron beam inspection apparatus, although it is desirable to have a shorter optical path length in the electron-optics system in order to suppress a drop in resolution due to the space charge effect, particularly in cases in which a high-current beam is used, if the Wien filter and the magnetic lens are installed near one another in order to shorten the optical path length, stray magnetic field from the magnetic lens sometimes enters into the Wien filter.

Further, in cases in which another device is installed in the area around the electron beam inspection apparatus, an external magnetic field generated by this device sometimes enters into the Wien filter.

Since the relationship between the electric and magnetic fields for causing the electron beam to propagate in a straight line (the Wien condition) will no longer hold if a stray magnetic field or an external magnetic field enters into the Wien filter, optical characteristics are adversely affected. For example, there may be beam deflection or there may be a drop in resolution.

However, in the present embodiment, since the second magnetic shield 12 is disposed so as to cover the area around the first magnetic shield 11 and the second magnetic shield 12 is magnetically connected to the lens barrel 20 via the second support member 14, although stray magnetic field from the magnetic lens (for example, the objective lens 727) in close proximity to the Wien filter 726 flows into the lens barrel 20 from the second magnetic shield 12 via the second support member 14, since the first magnetic shield 11 and the second magnetic shield 12 are magnetically insulated by the first support members 13, stray magnetic field does not flow into the first magnetic shield 11. Further, although a pulsed external magnetic field generated by an external high-voltage power supply or the like will flow into the second magnetic shield 12 from the lens barrel 20 via the second support member 14, since the first magnetic shield 11 and the second magnetic shield 12 are magnetically insulated by the first support members 13, such external magnetic field will not flow into the first magnetic shield 11. Thus, stray magnetic fields and external magnetic fields are prevented from entering inside the first magnetic shield 11, and a desired magnetic field formed at the inner side of the plurality of electromagnetic poles is prevented from being disturbed by stray magnetic fields and external magnetic fields. Consequently, in the Wien filter 726, a high magnetic shielding effect can be obtained.

Note that various modifications may be made to the embodiment described above. In the following, a modified example will be described with reference to the drawings. In the following description, and in the drawings employed by the following description, reference numerals identical to the reference numerals employed for corresponding portions in the above embodiment will be employed for portions that are able to be configured similarly to in the above embodiment, and duplicate explanation thereof will be omitted.

<Modified Example of Wien Filter>

Figure 4:
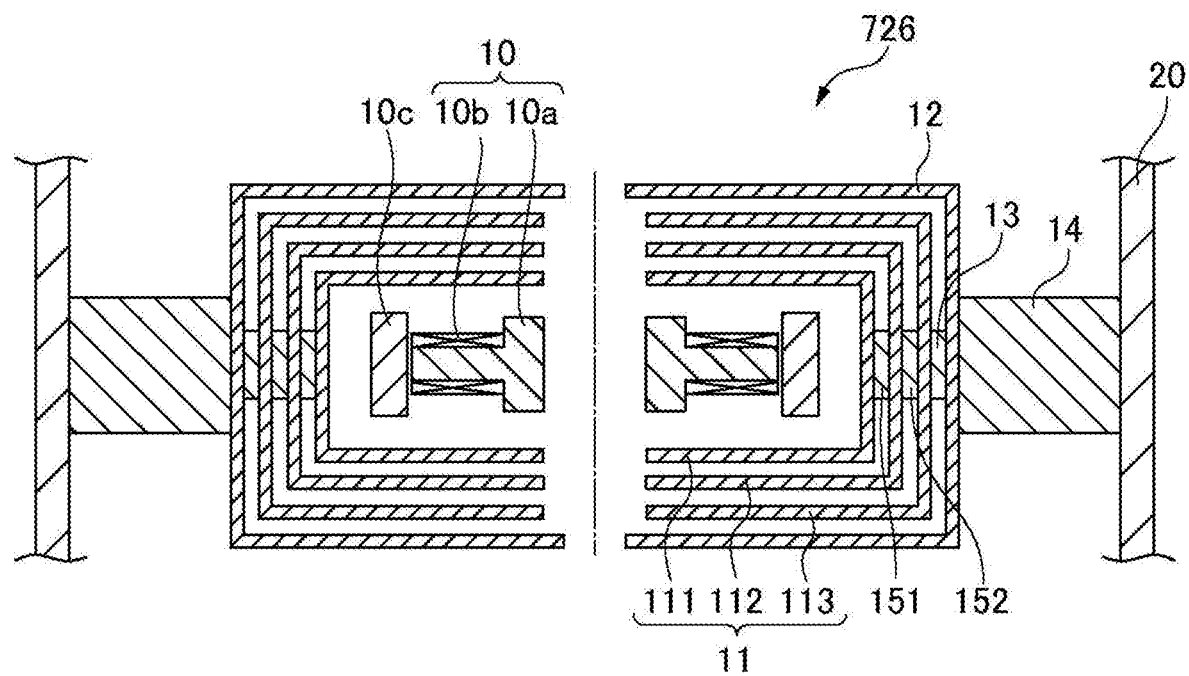
FIG. 4 is a diagram illustrating the configuration of a Wien filter according to a modified example of the embodiment.

FIG. 4 is a diagram illustrating the configuration of a Wien filter 726 according to a modified example of the embodiment.

In the example illustrated in FIG. 4, the first magnetic shield 11 has a plurality of shielding element members 111, 112, and 113 that are disposed in a nested manner. In the following, the plurality of shielding element members 111 to 113 are, in sequence from the inside, referred to as a first shielding element member 111, a second shielding element member 112, and a third shielding element member 113.

Of the first shielding element member 111 and the second shielding element member 112, which are adjacent to one another, the inner first shielding element member 111 is supported by support members 151 made of a non-magnetic material provided at the inner surface of the outer second shielding element member 112 (in the illustrated example, the inner surface of the sidewall thereof).

Similarly, of the second shielding element member 112 and the third shielding element member 113, which are adjacent to one another, the inner second shielding element member 112 is supported by support members 152 made of a non-magnetic material provided at the inner surface of the outer third shielding element member 113 (in the illustrated example, the inner surface of the sidewall thereof).

The material of the support members 151, 152 is not particularly limited so long as the material is a non-magnetic material, and for example, the same material can be used for the support members 151, 152 as for the first support members 13.

Having the support members 151, 152 connecting adjacent shielding element members 111, 112, and 113 be made of a non-magnetic material magnetically insulates adjacent shielding element members 111, 112, and 113 from one another.

Each of the shielding element members 111, 112, and 113 are formed with a hole for creating a vacuum (not illustrated in the drawings).

Of adjacent shielding element members 111, 112, and 113, the hole for creating a vacuum in an inner shielding element member and the hole for creating a vacuum in an outer shielding element member may be formed in mutually differing angular directions about the center axis of the lens barrel 20. For example, the hole for creating a vacuum in the first shielding element member 111 may be formed in the 12 o'clock direction, the hole for creating a vacuum in the second shielding element member 112 may be formed in the 3 o'clock direction, and the hole for creating a vacuum in the third shielding element member 113 may be formed in the 6 o'clock direction.

With the above configuration, since the plurality of shielding element members 111, 112, and 113 of the first magnetic shield 11 disposed in a nested manner are magnetically insulated from one another by the support members 151, 152, even if, for example, a stray magnetic field or an external magnetic field that has flowed into the second magnetic shield 12 were to flow into the outer third shielding element member 113, this would not readily flow therefrom into the inner second shielding element member 112, and would even less readily flow into the inner first shielding element member 111. Consequently, in the Wien filter 726, the magnetic shielding effect can be further enhanced.

With such configuration, even if the plurality of shielding element members 111, 112, and 113 of the first magnetic shield 11 are disposed in a nested manner, by forming the holes for creating a vacuum in adjacent shielding element members 111, 112, and 113 in mutually differing angular directions, a vacuum can be efficiently created in the narrow spaces between the shielding element members 111, 112, and 113.

Although an embodiment and a modified example of the present technology have been described by way of example, the scope of the present technology is not limited thereto, and various changes and modifications may be implemented as appropriate according to usage within the scope set forth in the claims. The embodiment and modified example may also be combined, as appropriate, so long as no processes conflict with one other.

What is claimed is:

1. A Wien filter to be disposed inside a lens barrel made of a magnetic material, comprising:
   a plurality of electromagnetic poles disposed at equal angular intervals about a center axis of the lens barrel;
   a first magnetic shield disposed so as to cover the area around the plurality of electromagnetic poles; and
   a second magnetic shield disposed so as to cover the area around the first magnetic shield, wherein
   the first magnetic shield is supported by a first support member made of a non-magnetic material provided at an inner surface of the second magnetic shield, and
   the second magnetic shield is supported by a second support member made of a magnetic material provided at an inner surface of the lens barrel.

2. The Wien filter according to claim 1, wherein:
   an electron beam pass-through hole centered on the center axis of the lens barrel is formed in each of the first magnetic shield and the second magnetic shield; and
   the diameter of the electron beam pass-through hole in the second magnetic shield is smaller than the diameter of the electron beam pass-through hole in the first magnetic shield.

3. The Wien filter according to claim 1, wherein:
   the first magnetic shield has a plurality of shielding element members disposed in a nested manner; and
   of adjacent shielding element members, an inner shielding element member is supported by a support member made of a non-magnetic material provided at an inner surface of an outer shielding element member.

4. The Wien filter according to claim 3, wherein:
   a hole for creating a vacuum is formed in each shielding element member; and
   of adjacent shielding element members, the hole for creating a vacuum in the inner shielding element member and the hole for creating a vacuum in the outer shielding element member are formed in mutually differing angular directions about the center axis of the lens barrel.

5. The Wien filter according to claim 1, wherein:
   the second support member is provided so as to extend circumferentially along the inner surface of the lens barrel.

6. The Wien filter according to claim 1, wherein:
   there are at least eight of the electromagnetic poles.

7. An electron-optics apparatus, comprising:
   the Wien filter according to claim 1; and
   a magnetic lens disposed in close proximity to the Wien filter in an axial direction.

* * * * *